United States Patent [19]

Hantusch

[11] 4,288,808
[45] Sep. 8, 1981

[54] CIRCUIT STRUCTURES INCLUDING INTEGRATED CIRCUITS

[75] Inventor: Gerald H. Hantusch, Cheadle, England

[73] Assignee: International Computers Limited, London, England

[21] Appl. No.: 5,918

[22] Filed: Jan. 23, 1979

[30] Foreign Application Priority Data

Jan. 28, 1978 [GB] United Kingdom ............... 03549/78

[51] Int. Cl.³ ........................ H01L 23/48; H05K 3/30
[52] U.S. Cl. ........................................ 357/68; 29/834; 29/832; 156/647; 156/657; 156/662
[58] Field of Search ..................... 29/832, 576 T, 580, 29/590, 834, 846, 833, 836, 840; 156/657, 659.1, 662, 647; 357/79, 68; 228/165, 180 A; 174/68.5

[56] References Cited

U.S. PATENT DOCUMENTS

| | | | |
|---|---|---|---|
| 3,585,714 | 6/1971 | Chou | 29/580 |
| 3,716,907 | 2/1973 | Anderson | 357/68 X |
| 3,725,160 | 4/1973 | Bean et al. | 156/662 X |
| 4,070,748 | 1/1978 | Legat et al. | 29/580 X |

FOREIGN PATENT DOCUMENTS 2747414 4/1978 Fed. Rep. of Germany ...... 156/657
1542572 3/1979 United Kingdom .

Primary Examiner—Nicholas P. Godici
Assistant Examiner—C. J. Arbes
Attorney, Agent, or Firm—Hane, Roberts, Spiecens & Cohen

[57] ABSTRACT

The specification discloses a structure for locating integrated circuits on a substrate by etching V grooves in a silicon substrate arranged to co-operate with spheroidal connectors on the integrated circuit. Contact pads are located in the V grooves whereby connections are made to the integrated circuit through the spheroidal connectors.

9 Claims, 2 Drawing Figures

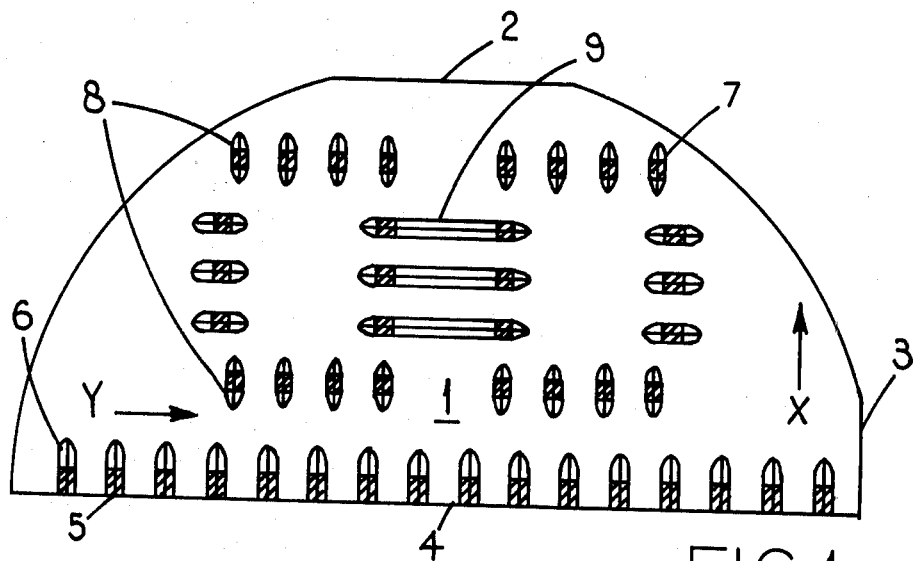
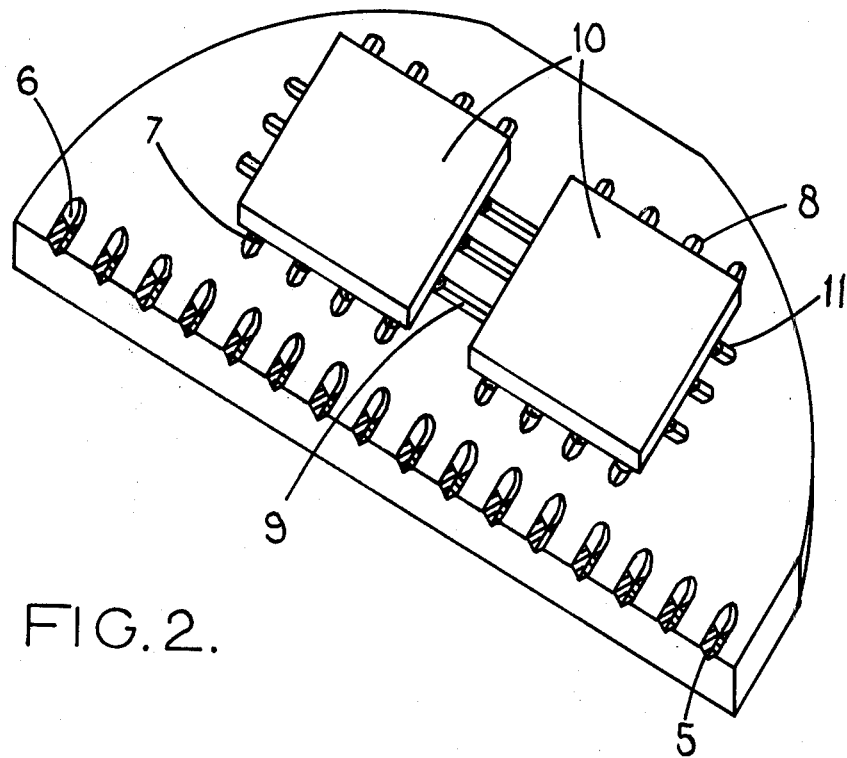

CIRCUIT STRUCTURES INCLUDING INTEGRATED CIRCUITS

BACKGROUND TO THE INVENTION

The present invention relates to circuit structures and in particular to structures in which integrated circuit chips are attached to a common substrate.

It has previously been proposed to attach integrated circuit chips to a substrate by the so called flipchip method. This method requires the provision of raised contact pads or bumps on the integrated circuit chip which are bonded in electrical contact to conductive tracks or pads on the common substrate. Hitherto, problems have been experienced in aligning the chips accurately on the common substrate to thus ensure that every contact pad or bump on each circuit chip makes contact with its corresponding track or pad on the substrate. In addition problems of differential expansion due to temperature changes have been experienced when the chips and the substrate have been of dissimilar materials.

SUMMARY OF INVENTION

According to one aspect of the present invention a method of manufacturing a circuit structure including integrated circuit comprises the steps of providing a planar member of semi-conductor material; forming on one surface of said member a plurality of recesses of V-section; forming on said one surface a plurality of electrical conductors including contact areas arranged in a predetermined pattern, each contact area having at least a portion thereof lying in one of said recesses; providing an integrated circuit chip of semi-conductor material, the chip carrying on one surface a plurality of raised electrically conductive contact pads arranged in a formation corresponding to said predetermined pattern; aligning the contact pads on the chip one with each corresponding contact area on the planar member by locating each contact pad in the recess of the corresponding contact area; and bonding each contact pad to the corresponding contact area to provide electrical contact therebetween.

According to another aspect of the present invention a circuit structure comprises a planar member of semi-conductor material having on one surface thereof a plurality of recesses of V-section and a plurality of conductors including contact areas arranged in a predetermined pattern, each contact area having at least a portion thereof lying in one of said recesses; and an integrated circuit chip of semi-conductor material carrying on one surface a plurality of raised electrically conductive contact pads arranged in a formation corresponding to said predetermined pattern, each contact pad being respectively bonded in electrical contact into the recess of the corresponding contact area on the substrate.

According to yet another aspect of the present invention a method of manufacturing a substrate for mounting an integrated circuit element having raised contact pads arranged in a predetermined pattern comprises the steps of providing a planar member of semi-conductor material; forming on one surface of said member a plurality of recesses of V-section serving to co-operate with the raised contact areas and thereby locate said element on the substrate; and forming on said one surface a plurality of electrical conductors including contact areas arranged in said predetermined pattern, at least a portion of each contact area lying in a corresponding one of the recesses.

BRIEF DESCRIPTION OF THE DRAWINGS

The invention will now be described, by way of example, with reference to the drawing accompanying the Provisional Specification in which, FIG. 1 is a plan view of a silicon substrate which is arranged to carry two integrated circuit chips, and FIG. 2 is a perspective view of a circuit structure showing the substrate with integrated circuit chips mounted thereon.

DESCRIPTION OF PREFERRED EMBODIMENT

Referring to FIG. 1 of the drawing, a semi-circular substrate 1 constructed of silicon has a radius of 0.1 inches. Two flats 2 and 3 on its periphery are disposed orthogonally one to the other. The straight edge 4 of the substrate carries electrically conductive contacts 5 and is arranged to co-operate with a multi-socket connector (not shown) in order that the substrate can be connected to a larger printed circuit board, for example, so that signals can be transmitted to an from the substrate. The contacts 5 are formed within V-section grooves 6.

Electrically conductive contact areas 7, having dimensions of approximately 0.004 to 0.006 inches square, are arranged in two groups, the contact areas of each group defining a rectangle having four contact areas disposed along each of two opposite sides and three contact areas disposed along each of the other two sides. The pattern of contact areas 7 in each group is arranged to correspond with a pattern of raised contact pads on an integrated circuit chip which is subsequently to be bonded to the substrate 1 with the contact pads of the chip in electrical contact with respective contact areas on the substrate. The contact areas 7 are disposed within further V-section grooves 8 and 9, the V-section grooves 8 extending in the same direction as the V-section grooves 6 and the V-section grooves 9 extending in a direction perpendicular to the grooves 6 and 8.

Although not shown in the Figures, it will be realised that electrical connections between the contacts 5 and contact areas 7 and between the contact areas 7 of the two groups are required. These can be provided by depositing conductive tracks using similar deposition techniques as are used to provide the contacts 5 and the contact areas 7. Also if desired the contact areas 7 may extend beyond the edges of the grooves 8 and 9.

The integrated circuit chips 10, shown in FIG. 2, are also formed from silicon and are 0.052 inches square. Raised contact pads 11 on their undersides are provided by spheroidal solder bumps and the chips are fully passivated with silicon nitride. Such integrated circuit chips are known and are available as standard items.

When an integrated circuit chip 10 is positioned on the substrate 1 each of the spheroidal solder contact pads 11 will be located within the V-section groove of its respective contact area. As the V-section grooves of contact areas 7 on adjacent sides of the square are disposed orthogonally to one another the grooves are effective to accurately align the chip relative to the substrate. When the back of the circuit chip is heated the contact pads 11 will liquify, the surface tension of the liquid solder pulling the chip towards the substrate. After the solder has cooled and solidified the contact pads of the circuit chip will be firmly bonded in electrical contact to their corresponding contact areas 7.

Electrical connections between the multi-socket connector (not shown) and the contacts 5 may be attained in a similar manner, the V-section grooves of the contacts 5 this time serving to accurately locate the contacts 5 relative to a multi-socket connector in position.

The silicon substrate is produced using conventional silicon processing techniques and a method of producing the substrate will now be described. The semi-circular substrate 1 is obtained by halving a conventional circular silicon wafer of 0.2 inches diameter. The circular silicon wafer will have been previously cut from a larger portion of silicon in the so called (100) orientation. Cutting the silicon in this way ensures that two orthogonally disposed preferred crystal planes, (designated X and Y in FIG. 1), extend orthogonally to the plane of the wafer. The flats 2 and 3 are provided on the circular wafer to indicate the orientation of the two preferred crystal planes and when the wafer is halved it is cut across its diameter along a line parallel to the flat 2 (i.e. along the Y plane). It will be noted that this line bisects the flat 3 to leave part of this flat on each of the half wafers.

Having produced the semi-circular silicon substrate it is first cleaned and then oxidised entirely over its surface. The oxidised surface is then photoetched to form the grooves 6, 8 and 9. It will be noted that the grooves 6 and 8 are aligned with the preferred crystal plane X and the grooves 9 are aligned with the preferred crystal plane Y. The significance of these preferred crystal planes is that selective etchants are available which when utilised to etch along the preferred planes produce a V-section groove in the silicon the depth of which is determined by the width of the groove irrespective of the time that the etchant is in contact with the silicon. This photo-etching operation is carried out in a conventional manner using a mask containing a pattern corresponding to the grooves, the flats 2 and 3 on the periphery of the substrate allowing the patterns in the mask to be accurately aligned with the preferred crystal planes. For further details of forming V-section grooves in a silicon substrate reference may be made to a paper entitled "Dielectric Isolation: Comprehensive, Current and Future" by K E Bean and W R Runyan in the "Journal of the Electrochemical Society" of January 1977.

After the grooves have been formed the grooved surface of the substrate is re-oxidised and then metallised all over. A second photo-etching operation is carried out to form the contacts 5 and the contact areas 7 within the grooves and also to provide the interconnections required between the contacts 5 and the contact areas 7. Finally the substrate is passivated all over with, for example, silicon nitride, and is again photo-etched to expose the contacts 5 and the contact areas 7.

Although the embodiment of the invention described shows a relatively small semi-circular substrate carrying two integrated circuit chips, it will be realised that the substrate could be much larger, for example 2.0 or even 4.0 inches in diameter, and arranged to carry a larger number of circuit chips.

Furthermore, the substrate need not be semi-circular in shape but could, in fact, be of any convenient shape cut from the circular wafer having at least one straight edge, aligned with one of the preferred crystal planes, for connection purposes. Substrates formed by halving or quartering a circular wafer have been found to be the most convenient.

What is claimed is:

1. A method of manufacturing a circuit structure including integrated circuit comprising the steps of providing a planar member of semi-conductor material; forming on one surface of said member a plurality of recesses of V-section; forming on said one surface a plurality of electrical conductors including contact areas arranged in a predetermined pattern, each contact area having at least a portion thereof lying in one of said recesses; providing an integrated circuit chip of semi-conductor material, the chip carrying on one surface a plurality of raised electrically conductive contact pads arranged in a formation corresponding to said predetermined pattern; aligning the contact pads on the chip one with each corresponding contact area on the planar member by locating each contact pad in the recess of the corresponding contact area; and bonding each contact pad to the corresponding contact area to provide electrical contact therebetween.

2. A circuit structure comprising a planar member of semi-conductor material having on one surface thereof a plurality of recesses of V-section and a plurality of conductors including contact areas arranged in a predetermined pattern, each contact area having at least a portion thereof lying in one of said recesses; and an integrated circuit chip of semi-conductor material carrying on one surface a plurality of raised electrically conductive contact pads arranged in a formation corresponding to said predetermined pattern, each contact pad being respectively bonded in electrical contact into the recess of the corresponding contact area on the substrate.

3. A method of manufacturing a substrate for mounting an integrated circuit element having raised contact pads arranged in a predetermined pattern comprising the steps of providing a planar member of semi-conductor material; forming on one surface of said member a plurality of recesses of V-section serving to co-operate with the raised contact pads and thereby locate said element on the substrate; and forming on said one surface a plurality of metallic electrical contact areas arranged in said predetermined pattern, at least a portion of each contact area lying in a corresponding one of the recesses.

4. A method as claimed in claim 3, comprising the steps of providing the recesses in elongate form; and arranging the elongate recesses in two groups, the recesses of one group being substantially orthogonally disposed with respect to the recesses of the other group.

5. A method as claimed in claim 3, in which the contact pads on the chip are formed from fusible material, and comprising the step of applying heat to the pads to cause them to melt and thereby become bonded to their corresponding contact areas.

6. A method as claimed in claim 3, comprising the steps of forming said planar member from a silicon wafer cut in the (100) orientation; and selectively etching said recesses along orthogonally disposed preferred crystal planes in the silicon.

7. A method as claimed in claim 6, in which the silicon wafer is semi-circular in shape and is obtained by halving a circular wafer.

8. A method as claimed in claim 6, in which the silicon wafer is a quarter sector of a circle and is obtained by quartering a circular wafer.

9. A circuit structure as claimed in claim 1, in which the recesses are elongate in form and are arranged in two groups, the recesses of one group being substantially orthogonally disposed with respect to the recesses of the other group.

* * * * *